United States Patent [19]

Muschke

[11] Patent Number: 4,895,615

[45] Date of Patent: Jan. 23, 1990

[54] MONOLITHIC FABRICATION TECHNIQUES FOR FRONT FACE OPTOELECTRONIC COUPLERS AND/OR OPTICAL COMPONENTS INCLUDING RIDGE STRUCTURED WAVEGUIDES

[75] Inventor: Markus Muschke, Brunnthal, Fed. Rep. of Germany

[73] Assignee: Siemens Aktiengesellschaft, Berlin and Munich, Fed. Rep. of Germany

[21] Appl. No.: 319,010

[22] Filed: Mar. 3, 1989

[30] Foreign Application Priority Data

Mar. 9, 1988 [DE] Fed. Rep. of Germany ....... 3807777

[51] Int. Cl.⁴ ..................... H01L 21/306; B44C 1/22; C03C 15/00; C03C 25/06
[52] U.S. Cl. ................................. 156/643; 156/646; 156/652; 156/655; 156/661.1; 156/662; 156/657; 350/96.12; 350/96.15; 372/50; 437/129; 204/192.35; 204/192.37
[58] Field of Search ............... 156/643, 646, 650, 652, 156/655, 657, 659.1, 661.1, 662; 350/96.11, 96.12, 96.15; 357/17, 19, 30; 372/46, 48, 50; 437/23, 55, 129; 204/192.32, 192.35, 192.37

[56] References Cited

FOREIGN PATENT DOCUMENTS 60-187078 9/1986 Japan .

OTHER PUBLICATIONS

Laser and Optoelectronik, vol. 16, No. 3, Sep. 1984, pp. 176-186.
Electronics Letters, vol. 21, No. 25/26, Dec. 1985, pp. 1209-1210.
Journal of Optical Communications, vol. 6, No. 2, Jun. 1985, pp. 42-43.
Jour. of Vacuum Sci. & Tech., vol. 3, No. 3, May-Jun. 1985, pp. 884-888.

Primary Examiner—William A. Powell
Attorney, Agent, or Firm—John Francis Moran

[57] ABSTRACT

The invention involves a method for the monolithic fabrication of front face optoelectronic couplers and/or optical components (10) including a ridge structured waveguide (4) in which the light-coupling edges (2) of the component (10) using a mask in the desired structure are etched out of a wafer (1) of suitable material. With this method not only the light-coupling edges (2) of the component (10) but also the ridge waveguides (4) are readily fabricated in monolithic technology. To this end, the invention provides that the etched grooves (3) forming the light-coupling edges (2) with their side walls are covered with a first layer (5) of organic material which subsequently is removed outside the groove (3) so that the remaining residue at least nearly fills the etched groove (3), and that subsequently over the first a second layer (6) of organic material is applied which after appropriate treatment is used as etching mask for etching the predetermined ridge waveguide structure (4) out of the wafer (1). This method is particularly especially useful in the fabrication of MCRW (metal cladded ridge waveguide) lasers.

16 Claims, 1 Drawing Sheet

MONOLITHIC FABRICATION TECHNIQUES FOR FRONT FACE OPTOELECTRONIC COUPLERS AND/OR OPTICAL COMPONENTS INCLUDING RIDGE STRUCTURED WAVEGUIDES

BACKGROUND OF THE INVENTION

The present invention relates to a method for the monolithic fabrication of the front face of an optoelectronic and/or optical couplers, and it relates, more particularly, to the fabrication of such coupler components including waveguide structures.

For the efficient production of optical elements and optoelectronic semiconductor elements, it is common to fabricate as large a number of identical elements as possible on a small sheet (wafer or chip) of a suitable material, for example semiconductor material or lithium niobate ($LiNbO_3$), is required. In the case of edge-emitting ridge waveguides, such as for example MCRW (metal cladded ridge waveguide) laser diodes, this requires that all technology steps should be carried out on the wafer of semiconductor material. Among them is also the complex procedure for the manufacture of the emitting edges such as, for example, of the laser mirrors, and in particular of the ridge waveguide itself.

This problem could until now not be solved by using a monolithic technology approach, since with conventional technologies for the manufacture of such elements always produces unintentional malformation at the light-emitting edges or mirrors of the components which made regular operation and achievement of an acceptable yield very difficult or impossible. For this reason the light-emitting edges of ridge waveguides were until now manufactured by fracturing along the (material specific) crystal axis suitable for this purpose.

In the meantime, it has become possible to realize laser diodes in monolithic technology on a semiconductor wafer. To manufacture the plane parallel end faces (laser mirror) functioning as a laser resonator, the semiconductor surface to be protected is covered with a photo lacquer of the desired geometric structure. Through a dry etching process, the desired mirror structure is subsequently obtained on the semiconductor wafer with the side walls of the etching grooves produced forming partially the edge-emitting areas or laser mirrors.

SUMMARY OF THE INVENTION

It is an object of the present invention to provide a method for the fabrication of front face-couplable optoelectronic and/or optical elements with ridge waveguide structure of the previously described type in which the light-coupling edges of the element as well as also the ridge waveguides are realizable through monolithic technology, and which permits not only cost-efficient manufacture of edge-emitting optoelements but additionally an integration of the edge-emitting ridge waveguide with additional optical and/or electronic components on a wafer of suitable material.

A method according to the principles of the invention not only permits the manufacture of cost-efficient front face couplable optoelectronic and/or optical elements but, in addition, edge-emitting ridge waveguides can be combined onto the wafer. The ridge waveguides can have the form of depressions as well as elevations.

With the method according to the invention it becomes in particular possible to etch, in addition to the mirror structure, a ridge waveguide structure into a semiconductor wafer. For this purpose the photo lacquer mask for the etching of the mirror or the light-emitting edges is applied on the wafer after preparation of the wafer surface over the entire surface. Preparation of the wafer surface is, of course, dependent on the particular component to be processed. In the case of the MCRW laser this would be, for example, contact diffusion over the entire surface and a first p-contact metallization.

After the wet or dry structuring and the potentially necessary coating of the etched areas, which must be as much as possible planar and perpendicular to the wafer surface, the mirror grooves originating in the etching process are covered with a suitable photo lacquer. The photo lacquer outside the mirror groove is exposed and removed by development. It is a feature of the invention that the photo lacquer layer does not necessarily need to form a closed surface with the wafer surface in the groove region. Rather it is sufficient if the mirror groove is at least nearly filled by the photo lacquer layer, i.e. approximately to at least 80%. Subsequently, the first photo lacquer is heated and specifically at temperatures which make it insensitive to light but not chemically insoluble, advisably acetone-soluble. Thereupon a suitable second photo lacquer is applied over the first. This is exposed with a ridge waveguide photo mask. After the photo lacquer is developed, a ridge waveguide etching mask which also is faultless in the mirror region is available. Now the wafers are again subjected to a structuring and optionally also a passivation procedure. The result in the special case of a MCRW laser is a faultless monolithically processed ridge waveguide which ends in a monolithically produced mirror.

Later a metallization, for example by means of a lift-off technique, can be applied. After such a second metallization the complete p-contact would now be present on the wafer in the case of the monolithic MCRW laser technology. The remaining technology steps to be preformed correspond to the general state of the art.

In the process of separation of the elements a method is preferably applied which is subject matter of a previously disclosed technique German Patent Application No. P 37 31 312.6. To separate the components corresponding to parts of the wafer, in particular semiconductor wafer, which need to be protected are provided with a mask. Subsequently, into the bottom surface of the etched grooves either through wet chemical or dry etching techniques a further groove depression is etched. Subsequently the elements are separated by breaking directly or after an additional step such as scratching, groove etching or sawing. Wet etching typically involves a solution such as 3:1:1 etching agent having the composition $3H_2SO_4:1H_2O_2:1H_2O$ while dry etching typically involves the use of a chlorine plasma.

BRIEF DESCRIPTION OF THE DRAWING

Additional features of the invention and additional objects of the invention will be more readily appreciated and better understood by reference to the following detailed description which should be considered in conjunction with the drawing.

DETAILED DESCRIPTION

Figure 1:
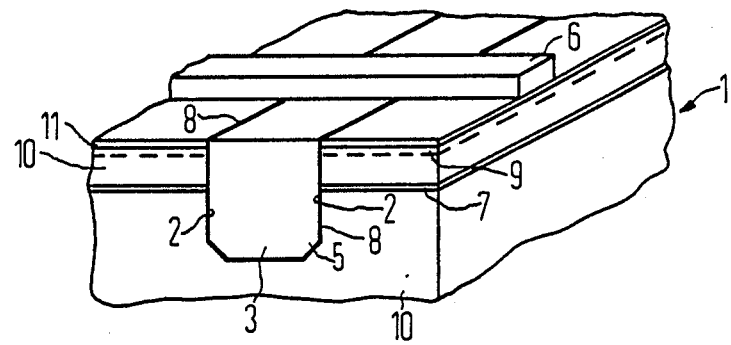
FIG. 1 illustrates a detailed laser structure after the first etching.
Figure 2:
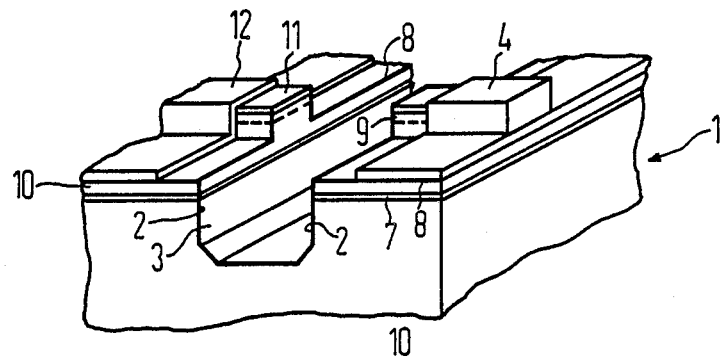
FIG. 2 depicts a completely etched laser structure with a p-contact.

In the fabrication of the edge-emitting optoelectronic semiconductor component 10 with ridge waveguide structure 4, in this case an illustrative MCRW laser, the light-emitting edges (mirror) 2 of the component 10 have been etched using a mask in the desired structure from a semiconductor wafer 1, which in an epitaxy process has been provided with a layer sequence depending on component 10. In this illustrative arrangement starting at the top the following layer sequence is present: a first p-contact-metallization 11, below that a Zn-diffusion zone 9 with the p-conducting region. Adjoining it is the active zone 7 of the laser, i.e. the resonator region. Below that are the n-conducting layers, with an n-conducting substrate being used as semiconductor wafer 1 which has on its underside a (not shown) metallization. The etched grooves 3 formed through the wet chemical or dry etching technique partially forming the light-emitting edges (mirror) 2 of component 10 are covered with a suitable first photo lacquer layer 5. The first photo lacquer layer 5 is exposed in the region outside he etched groove 3 and removed by developing. The remaining portion of the first photo lacquer layer 5 is heated at such a temperature that it becomes light-insensitive but chemically not insoluble. For example, layer 5 may be advisably acetone-soluble. Over the first photo lacquer layer 5, a second photo lacquer layer 6 is subsequently applied. This second photo lacquer layer 6 is exposed in the desired structure and developed so that a ridge waveguide etching mask is formed such as is apparent in FIG. 1. Lastly, the ridge waveguide structures 4 determined by the mask are etched from the semiconductor wafer 1 with dry etching techniques or wet chemically. In this way the structure depicted in FIG. 2 is obtained. The layer sequence is identical to that shown in FIG. 1. The aluminum oxide layer ($Al_2O_3$ layer) 8 functions for coating the mirror or the light-emitting edges 2 and includes in FIG. 2 the front face regions of the ridge waveguides 4. After a second metallization 12 subsequently undertaken the completed p-contact is present on the semiconductor wafer 1 in the depicted case of the MCRW laser technology.

The method according to the invention is not limited to the described illustrative embodiment. This method can be applied to nearly any form of light wave carrying structures which are combined in monolithic technology with monolithically fabricated light-coupling edges. With the method according to the invention, for example, optical waveguides or modulators based on lithium niobate may also be realized. The method according to the invention is also applicable to the fabrication of directional couplers in which, for example, the light guide fibers are connected in accordance with the application of front face coupling with a lithium niobate chip and carried in V-shaped paths etched into silicon. Similar components are also manufacturable, for example using material combinations such as GaAlAs/GaAs.

There has thus been shown and described a novel process for optical couplers which fulfills all the objects and advantages sought therefor. Many changes, modifications, variations and other uses and applications of the subject invention will, however, become apparent to those skilled in the art after considering this specification and the accompanying drawing which disclose the preferred embodiments thereof. All such changes, modifications, variations and other uses and applications which do not depart from the spirit and scope of the invention are deemed to be covered by the invention which is limited only by the claims which follow.

I claim:

1. A method for the monolithic fabrication of front face coupling of one of a group of components consisting of optoelectronic and optical components including a ridge waveguide structure in which the light-coupling edges of the component via a mask in the desired structure are etched out of a wafer of suitable material, which has been provided by at least one of a group processes consisting of an epitaxy-process, a diffusion-process and an implantation process with a sequence of layers depending on the component, the method comprising the steps of: covering etching grooves formed by either wet chemical or dry etching techniques having substantially perpendicular side walls serving as light-coupling edges of the component with suitable first layer of organic material; phototechnically removing the first layer of organic material in the region outside of the etched groove by incineration or by chemical exposure so that a remaining portion of the first layer at least substantially fills the etched groove; applying a second layer of organic material over the first layer; structuring the second layer of organic material to form a ridge waveguide etching mask, and etching the ridge waveguide structures using the mask out of the wafer.

2. The method as stated in claim 1, wherein the wafer comprises a group of material consisting of glass, silicon, III-V semiconductor material or lithium niobate ($LiNbO_3$).

3. A method as stated in claim 1, wherein the first layer comprises a photo lacquer layer of organic material.

4. A method as stated in claim 2, wherein the first layer comprises a photo lacquer layer of organic material.

5. A method for the monolithic fabrication of edge-emitting optoelectronic semiconductor components having a ridge waveguide structure, in which the light-emitting edges of the component, via a mask are etched out of a semiconductor wafer, the semiconductor wafer being a product of an epitaxial process and including a sequence of layers suitable for laser operation, the method comprising the steps of: covering etched grooves formed by etching techniques to include nearly perpendicular side walls serving as light-emitting edges of the component with a suitable first layer of photo lacquer; exposing and removing by developing the first layer of photo lacquer in a region outside an etched groove; heating the remaining portion of the first layer of photo lacquer which at least nearly fills the etched groove to a predetermined temperature to make the first layer photo-insensitive but not chemically insoluble, applying a second layer of photo lacquer over the first layer of photo lacquer; exposing and developing the second layer to form a ridge waveguide etching mask and etching the ridge waveguide structures via the mask out of the wafer of semiconductor material.

6. A method as stated in claim 1, further includes the step of passivating the wafer of semiconductor material provided with the etched groove structure and the ridge waveguide structure.

7. A method as stated in claim 2, further includes the step of passivating the wafer of semiconductor material provided with the etched groove structure and the ridge waveguide structure.

8. A method as stated in claim 5, further includes the step of passivating the wafer of semiconductor material provided with the etched groove structure and the ridge waveguide structure.

9. A method as stated in claim 1, further includes the step of providing metallization on an outer portion of the ridge waveguides.

10. A method as stated in claim 2, further includes the step of providing metallization on an outer portion of the ridge waveguides.

11. A method as stated in claim 5, further includes the step of providing metallization on an outer portion of the ridge waveguides.

12. A method as stated in claim 1, wherein a mass is provided for separating the components corresponding to parts of the wafer to be protected, providing a further groove depression etched into the bottom surface of the etched groove subsequently separating the components by mechanical action of the group including scratching, groove etching or sawing.

13. The method of claim 1, characterized in that for wet etching using a 3:1:1 etching agent of the composition $3H_2SO_4:1H_2O_2:1H_2O$.

14. The method of claim 5, characterized in that for wet etching using a 3:1:1 etching agent of the composition $3H_2SO_4:1H_2O_2:1H_2O$.

15. The method of claim 1, wherein the etching step includes a dry etching using a chlorine plasma.

16. The method of claim 5, wherein the etching step includes a dry etching using a chlorine plasma.

* * * * *